United States Patent
He et al.

(10) Patent No.: US 10,700,103 B2
(45) Date of Patent: Jun. 30, 2020

(54) ARRAY SUBSTRATE WITH INORGANIC LIGHT-EMITTING DIODE AND DISPLAY DEVICE WITH INORGANIC LIGHT-EMITTING DIODE

(71) Applicant: BOE TECHNOLOGY GROUP CO., LTD., Beijing (CN)

(72) Inventors: Xiaolong He, Beijing (CN); Zhifu Li, Beijing (CN); Zhiyuan Ji, Beijing (CN); Jikai Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/772,304

(22) PCT Filed: Aug. 16, 2017

(86) PCT No.: PCT/CN2017/097634
§ 371 (c)(1),
(2) Date: Apr. 30, 2018

(87) PCT Pub. No.: WO2018/033092
PCT Pub. Date: Feb. 22, 2018

(65) Prior Publication Data
US 2018/0315775 A1    Nov. 1, 2018

(30) Foreign Application Priority Data

Aug. 19, 2016   (CN) .......................... 2016 1 0695442

(51) Int. Cl.
*H01L 27/12* (2006.01)
*G09G 3/32* (2016.01)
(Continued)

(52) U.S. Cl.
CPC ............. *H01L 27/124* (2013.01); *G09G 3/32* (2013.01); *H01L 27/127* (2013.01);
(Continued)

(58) Field of Classification Search
CPC ............. H01L 27/1214; H01L 27/3248; H01L 27/3258; H01L 29/41733; H01L 29/42384
See application file for complete search history.

(56) References Cited

U.S. PATENT DOCUMENTS 9,293,476 B2    3/2016   Bedell et al.
2007/0029554 A1  2/2007   Nakamura et al.
(Continued)

FOREIGN PATENT DOCUMENTS

CN    104112755 A    10/2014
CN    104282708 A    1/2015
(Continued)

OTHER PUBLICATIONS

First Office Action for Chinese Patent Application No. 201610695442.1 dated Mar. 5, 2018.
(Continued)

*Primary Examiner* — Hoai V Pham
(74) *Attorney, Agent, or Firm* — Calfee, Halter & Griswold LLP (57) ABSTRACT

An array substrate, a method for fabricating the same, and a display device are disclosed. The array substrate includes a substrate and a plurality of pixel units on the substrate. Each pixel unit comprises at least a thin film transistor and an ILED. A drain of each thin film transistor is connected with a first pole of each ILED through a first electrode line, and a second pole of each ILED is connected with a second electrode line. Since the ILEDs have the advantages of small size, high brightness, high contrast, lightness of weight, low consumption, wide gamut, high efficiency, long lifetime, quick response or the like, the array substrate onto which the ILEDs are applied by transferring has a high resolution, an improved display effect or the like.

20 Claims, 3 Drawing Sheets

(51) Int. Cl.
*H01L 29/417* (2006.01)
*H01L 29/423* (2006.01)
*G02F 1/1335* (2006.01)
*G02F 1/1333* (2006.01)
*H01L 29/786* (2006.01)

(52) U.S. Cl.
CPC ...... *H01L 27/1218* (2013.01); *H01L 27/1266* (2013.01); *H01L 29/41733* (2013.01); *H01L 29/42384* (2013.01); *G02F 1/133526* (2013.01); *G02F 2001/133357* (2013.01); *H01L 29/78678* (2013.01)

(56) References Cited

U.S. PATENT DOCUMENTS

| | | |
|---|---|---|
| 2014/0159043 A1 | 6/2014 | Sakariya et al. |
| 2014/0367633 A1 | 12/2014 | Bibl et al. |
| 2015/0333221 A1 | 11/2015 | Bibl et al. |
| 2016/0336374 A1 | 11/2016 | Jiang et al. |
| 2016/0351092 A1* | 12/2016 | Chen .................... G09G 3/3233 |
| 2017/0062514 A1* | 3/2017 | Park .................... H01L 25/0753 |
| 2018/0082984 A1 | 3/2018 | Qin |

FOREIGN PATENT DOCUMENTS

| | | |
|---|---|---|
| CN | 104871231 A | 8/2015 |
| CN | 104916527 A | 9/2015 |
| CN | 105528969 A | 4/2016 |
| CN | 106206611 A | 12/2016 |
| CN | 205944093 U | 2/2017 |
| CN | 106486492 A | 3/2017 |
| WO | 2015175131 A1 | 11/2015 |

OTHER PUBLICATIONS

Search Report and Written Opinion for International Application No. PCT/CN2017/097634 dated Nov. 16, 2017.
First Office Action for Indian Patent Application No. 201827007429 dated Jan. 29, 2020.
Extended Search Report for European Patent Application No. 178410643 dated Feb. 6, 2020.

* cited by examiner

ARRAY SUBSTRATE WITH INORGANIC LIGHT-EMITTING DIODE AND DISPLAY DEVICE WITH INORGANIC LIGHT-EMITTING DIODE

RELATED APPLICATIONS

The present application is the U.S. national phase entry of PCT/CN2017/097634, with an international filing date of Aug. 16, 2017, which claims the benefit of Chinese Patent Application No. 201610695442.1, filed on Aug. 19, 2016, the entire disclosures of which are incorporated herein by reference.

TECHNICAL FIELD

The present disclosure relates to the field of display technology, and particularly to an array substrate, a method for fabricating the same, and a display device.

BACKGROUND

With the development of tablet display technology, there are increasingly high requirements for the performance of a display panel. A display panel with high resolution, flexibility and transparency characteristics, high brightness, high contrast, light in weight, low consumption, and wide gamut or the like has become the development trend in the art.

A common display device usually includes a liquid crystal display device (LCD) and an organic light emitting diode (OLED). It is difficult to form a flexible display panel with a wide gamut and low power consumption from an LCD panel. It is further difficult to form a display panel with a high resolution, high transmittance, and long lifetime from an OLED panel. Thus, there is need for improving the performance of display panel in the art.

SUMMARY

Embodiments of the present disclosure intend to solve at least one of the technical problems in the art by providing an array substrate with a high resolution, high transmittance, light weight, low consumption, wide gamut, and a method for fabricating the same, as well as a display device.

Embodiments of the present disclosure provide an array substrate, including a substrate and a plurality of pixel units on the substrate, wherein each pixel unit includes one of thin film transistors and one of ILEDs (Inorganic Light-Emitting Diodes), a drain of each thin film transistor is connected with a first pole of each ILED through a first electrode line, and a second pole of each ILED is connected with a second electrode line In an embodiment of the present disclosure, the array substrate further includes a planarization layer, wherein the thin film transistors, the planarization layer and the ILEDs are arranged on the substrate in this order, wherein the planarization layer is provided with a connection hole at a position corresponding to the drain of each thin film transistor, and wherein the first electrode line connects the drain of each thin film transistor with the first pole of each ILED through the connection hole.

In one embodiment, the array substrate further includes a planarization layer, wherein the ILEDs, the planarization layer and the thin film transistors are arranged on the substrate in this respective order, wherein the planarization layer is provided with a connection hole at a position corresponding to the first pole of the ILED, and wherein the first electrode line connects the drain of each thin film transistor with the first pole of each ILED through the connection hole.

In one embodiment of the present disclosure, the first electrode line and the second electrode line are arranged in a same layer.

In the context of the present disclosure, "A is arranged in a same layer as B" means that A and B are made from the same material, by the same process. In some examples, "A is arranged in a same layer as B" means that a film is formed by the same film forming process, and then the film is subjected to a patterning process to form A and B. From the view point of structure, they are in the same stacking hierarchy among layers in the device.

In an embodiment of the present disclosure, in each pixel unit, a projection of each ILED on the substrate at least partially overlaps a projection of each thin film transistor on the substrate.

In an embodiment of the present disclosure, in each pixel unit, a projection of one of the ILED and the thin film transistor completely falls within a projection of the other one of the ILED and the thin film transistor.

In an embodiment of the present disclosure, the array substrate further includes a plurality of driver ICs, which are arranged in a same layer as the ILEDs and configured to provide signals for gate lines and/or data lines on the array substrate.

In an embodiment of the present disclosure, the array substrate further includes a plurality of microlens units, which are arranged on a light exit side of the array substrate, wherein the microlens units correspond with ILEDs in position.

In an embodiment of the present disclosure, a projection of each ILED on the substrate falls within a projection of each microlens unit on the substrate.

In an embodiment of the present disclosure, the plurality of pixel units are arranged in a matrix, and the second electrode line with which the second poles of ILEDs in a same row are connected is connected with a same signal input line.

In an embodiment of the present disclosure, the substrate includes any one of glass, plastic, silica, and silicon.

In an embodiment of the present disclosure, the thin film transistor includes any one of a polycrystalline silicon thin film transistor, an amorphous silicon thin film transistor, a monocrystalline silicon thin film transistor, an oxide thin film transistor, and an organic thin film transistor.

Embodiments of the present disclosure further provide a display device, including the array substrate as described above.

Embodiments of the present disclosure further provide a method for fabricating an array substrate, comprising: forming thin film transistors and ILEDs on a substrate, wherein the ILEDs are formed on the substrate by a transferring process, a drain of each thin film transistor is connected with a first pole of each ILED through a first electrode line, and a second pole of each ILED is connected with a second electrode line.

In an embodiment of the present disclosure, forming the thin film transistors and the ILEDs on the substrate includes:
forming the thin film transistors on the substrate by a patterning process;
forming a planarization layer;
transferring the ILEDs onto the planarization layer by a transferring process;

forming a connection hole in the planarization layer at a position to which the drain of each thin film transistor corresponds, by an etching process; and forming a pattern composed of at least the first electrode line and the second electrode line by a patterning process, wherein the first electrode line connects the drain of each thin film transistor with the first pole of each ILED through the connection hole, and the second electrode line is connected with the second pole of the ILED.

In an embodiment of the present disclosure, forming the thin film transistors and the ILEDs on the substrate includes:

forming the thin film transistors and the ILEDs on the substrate;

transferring the ILED onto the substrate by a transferring process;

forming the second electrode line by a patterning process, wherein the second electrode line is connected with the second pole of the ILED;

forming a planarization layer;

forming the thin film transistors by a patterning process;

forming a connection hole in the planarization layer at a position to which the first pole of each ILED corresponds, by an etching process; and forming the first electrode line by a patterning process, wherein the first electrode line connects the drain of each thin film transistor with the first pole of each ILED through the connection hole.

In an embodiment of the present disclosure, the method further includes:

during transferring the ILEDs onto the planarization layer by the transferring process, transferring a plurality of driver ICs onto the planarization layer by the transferring process.

In an embodiment of the present disclosure, the method further includes:

during transferring the ILED onto the substrate by the transferring process, transferring a plurality of driver ICs onto the substrate by a transferring process.

In an embodiment of the present disclosure, the method further includes:

forming a plurality of microlens units on a light exit side of the array substrate, wherein the microlens units correspond with ILEDs in position.

DETAILED DESCRIPTION OF EMBODIMENTS

The present disclosure will be described in detail hereinafter with reference to the accompanying drawings and specific implementations, for purpose of better conveying technical solutions of the present disclosure to the skilled in the art.

Reference numerals: 1 thin film transistor; 1A active layer; 1D drain; 1G gate; 1GI gate insulating layer; 1S source; 2 planarization layer; 3 first electrode line; 4 second electrode line; 5 microlens unit; 6 driver IC; 7 input signal line; 8 ILED; 10 substrate.

It is noted that, in embodiments of the present disclosure, an ILED, a driver IC, a sensor module, a camera module, or the like have a micrometer-scale size, and particularly shall have a size smaller than 1 mm. In embodiments of the present disclosure, the expression "a layer is arranged on another layer" indicates the order for fabricating these two layers, and does not mean an upper layer and a lower layer in the macroscopic view.

As shown in FIGS. 1-7 and 9, the present disclosure provides an array substrate. The array substrate includes a substrate 10, and a plurality of gate lines and data lines (not shown) on the substrate 10. The gate lines and data lines intersect to define a plurality of pixel units. Each pixel unit includes one of thin film transistors 1 and one of ILEDs 8. A drain 1D of each thin film transistor 1 is connected with a first pole of each ILED 8 through a first electrode line 3, and a second pole of each ILED 8 is connected with a second electrode line 4. A source 1S of each thin film transistor 1 is connected with one of the data lines, and a gate 1G of each thin film transistor 1 is connected with one of the gate lines.

When a scan signal is input by a gate line, the thin film transistor 1 connected with the gate line is switched on, and the data voltage which is loaded on the data line is output to the first poles of the respective ILED 8 through the thin film transistor 1 and the first electrode line 3. Accordingly, a reference voltage (which has a voltage value different from the data voltage) is input to the second pole of the ILED 8 through the second electrode line 4, so as to drive the ILED 8 to emit light.

As for the above described array substrate, the present embodiment further provides a method for fabricating an array substrate. The method includes: a step of forming thin film transistors 1 on the substrate 10 and a step of forming ILEDs 8 by a transferring process, wherein the drain 1D of each thin film transistor 1 is connected with the first pole of each ILED 8 through the first electrode line 3, and the second pole of each ILED 8 is connected with the second electrode line 4.

The ILEDs 8 have the advantages of small size, high brightness, high contrast, light weight, low consumption, wide gamut, high efficiency, long lifetime, quick response and the like. In the present embodiment, the array substrate onto which ILEDs are applied by transferring has a high resolution, an improved display effect, or the like.

The array substrate of the present embodiment will be described hereinafter with reference to specific implementations.

Figure 1:
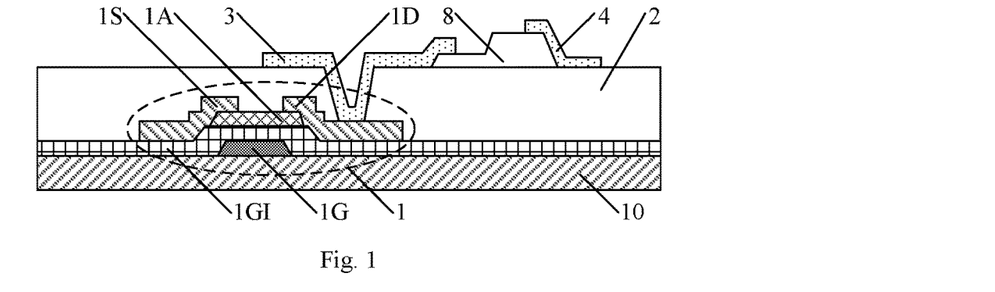
FIG. 1 is a schematic view for illustrating a pixel unit in an array substrate according to a first implementation of an embodiment of the present disclosure.

In a first implementation of the present embodiment, as shown in FIG. 1, the array substrate includes: the substrate 10; thin film transistors 1 on the substrate 10; a planarization layer 2 on the layer in which the thin film transistors 1 are located (the planarization layer 2 is provided with a connection hole at a position to which the drain 1D of each thin film transistor 1 corresponds); ILEDs 8 on the planarization layer 2; and the first electrode line 3 and the second electrode line 4 on the layer where the ILEDs 8 are located. In this array substrate, gate lines are arranged in a same layer as the gate 1G of each thin film transistor 1, and data lines are arranged in a same layer as the source 1S and drain 1D of each thin film transistor 1. The first electrode line 3 connects the drain 1D of each thin film transistor 1 with the first pole of each ILED 8 through the connection hole, and the second electrode line 4 is connected with the second pole of each ILED 8.

Figure 2:
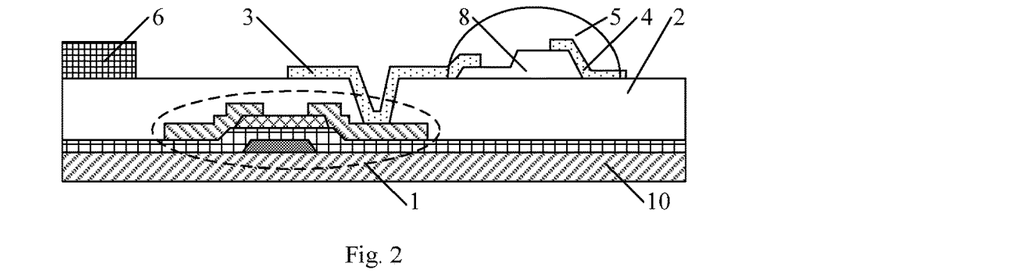
FIG. 2 is a schematic view for illustrating an array substrate according to a first implementation of an embodiment of the present disclosure.

As shown in FIG. 2, a micro-driver IC 6 is arranged on the array substrate in a same layer as the ILEDs 8. The driver IC 6 may be integrated on the array substrate by transferring. The driver IC 6 provides signals for gate lines and/or data lines on the array substrate.

In case the driver IC 6 is a source driver, it is required that the planarization layer 2 should be provided with a connection hole at a position to which data lines correspond. Further, a third electrode line (not shown) is arranged in a same layer as the first electrode line 3 and the second electrode line 4. The third electrode line connects data lines with (a pin of) the driver IC 6 through the connection hole above data lines.

In case the driver IC 6 is a gate driver, it is required to provide a connection hole penetrating the planarization layer 2 and a gate insulating layer 1GI. The gate insulating layer 1GI is arranged between the gate 1G and an active layer 1A of the thin film transistor 1 (FIG. 1). Further, a fourth electrode line (not shown) is arranged in a same layer as the first electrode line 3 and the second electrode line 4. The fourth electrode line connects gate lines with (a pin of) the driver IC 6 through the connection hole penetrating the planarization layer 2 and the gate insulating layer 1GI.

In case the driver IC 6 is a chip in which a source driver and a gate driver are integrated, it is required that a connection hole should be provided in the planarization layer 2 at a position to which data lines correspond. Further, the third electrode line is arranged in a same layer as the first electrode line 3 and the second electrode line 4. The third electrode line connects data lines with (a pin of) the driver IC 6 through the connection hole above data lines. In addition, a connection hole is provided which penetrates the planarization layer 2 and the gate insulating layer 1GI. The gate insulating layer 1GI is arranged between the gate 1G and the active layer 1A of the thin film transistor 1. The fourth electrode line (not shown) is arranged in a same layer as the first electrode line 3 and the second electrode line 4. The fourth electrode line connects gate lines with (a pin of) the driver IC 6 through a connection hole which passes into the planarization layer 2 and the gate insulating layer 1GI.

Note that reference is made herein to a case in which the driver IC 6 in the array substrate is a source driver. However, embodiments of the present disclosure are not limited to this case.

A sensor module, a camera module or the like can further be integrated on the planarization layer 2 of the array substrate by micro-transferring, so as to form a multi-functional panel with a high integration density. This can increase the added value of the display panel, and the module can be lightweight.

Figure 7:
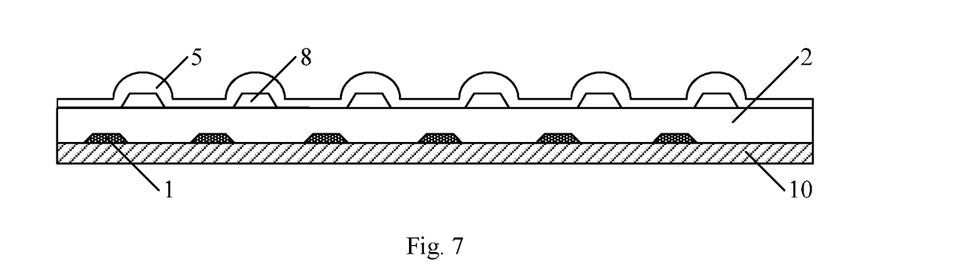
FIG. 7 is a structural view for illustrating an array substrate in an embodiment of the present disclosure.

As shown in FIG. 2 and FIG. 7, the array substrate can further include a plurality of microlens units 5 which are arranged on a light exit side of the array substrate. The microlens units 5 correspond with the ILEDs 8 in position.

Namely, each the microlens unit 5 completely covers one of the ILEDs 8. The microlens units 5 in this configuration facilitate increasing light extraction efficiency of ILEDs 8.

Figure 3:
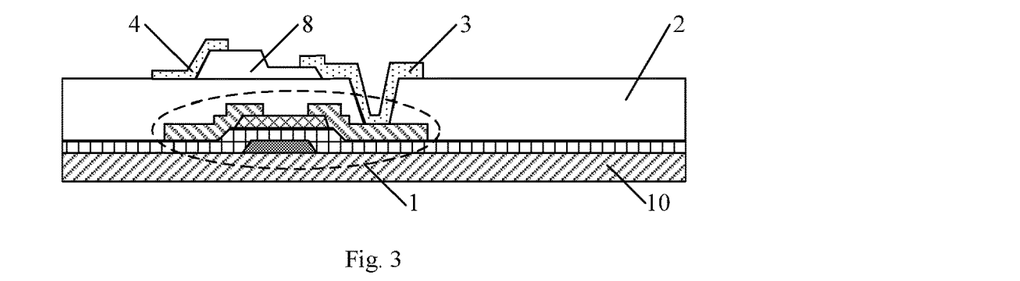
FIGS. 3 and 4 are schematic views for illustrating an array substrate according to a first implementation of an embodiment of the present disclosure.
Figure 4:
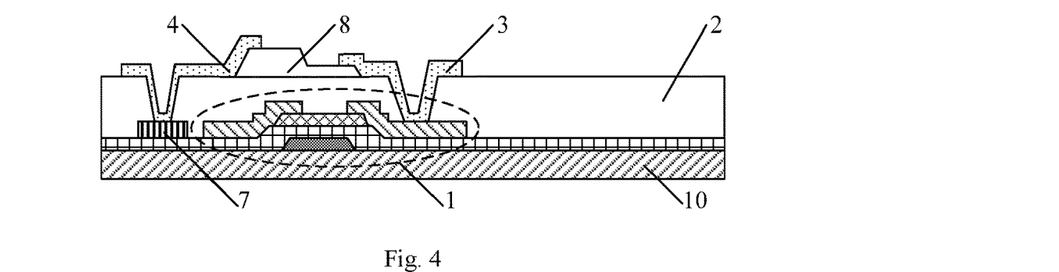

As shown in FIG. 3 and FIG. 4, in each pixel unit, a projection of each ILED 8 on the substrate 10 at least partially overlaps a projection of each thin film transistor 1. In an embodiment, as shown in FIG. 3, the second electrode line 4 is connected with the second pole of each ILED 8, and the signal input line (not shown in FIG. 3), which provides signals to the second electrode line 4, is arranged in a same layer as the second electrode line 4. In an alternative embodiment, as shown in FIG. 4, a signal input line 7 which provides signals to the second electrode line 4 is arranged in a same layer as the thin film transistor 1, e.g., in a same layer as the source and the drain, or in a same layer as the gate. In the embodiment shown in FIG. 4, a connection hole is provided in the planarization layer 2, so that the second electrode line 4 is connected with the signal input line 7 through the connection hole.

The projections of the ILED 8 and the thin film transistor 1 on the substrate 10 have an area equivalent to that of the pixel unit. When the ILED 8 and the thin film transistor 1 are arranged as shown in FIG. 3 and FIG. 4, the projections of the ILED 8 and the thin film transistor 1 on the substrate 10 have a relatively small area. Such a small area facilitates realizing a high resolution. In an exemplary embodiment, the projections of the ILED 8 and the thin film transistor 1 on the substrate 10 completely overlap.

Figure 5:
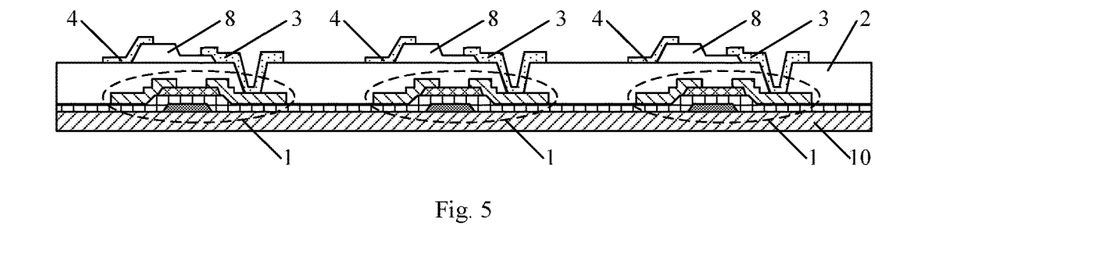
FIG. 5 and FIG. 6 are schematic views for illustrating the arrangement of pixel units in an array substrate in an embodiment of the present disclosure.
Figure 6:
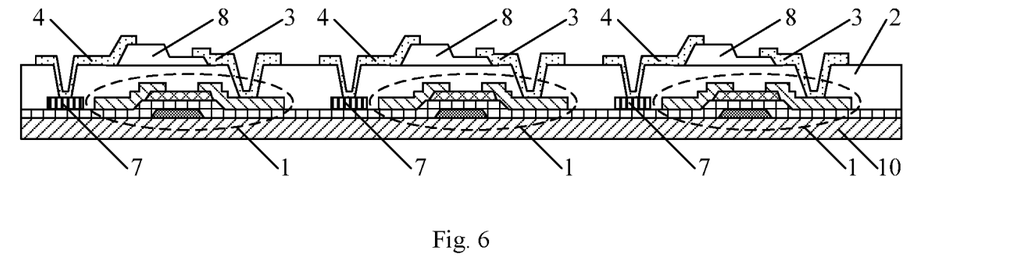

In an exemplary embodiment, as shown in FIGS. 5 and 6, the plurality of pixel units are arranged in a matrix, and the second electrode line 4 to which second poles of ILEDs 8 in a same row are connected is connected with a same signal input line 7. In particular, the embodiment shown in FIG. 5 corresponds to the embodiment shown in FIG. 3, and the embodiment shown in FIG. 6 corresponds to the embodiment shown in FIG. 4. In this configuration, the wiring is simple, and it is easy to drive.

Figure 8:
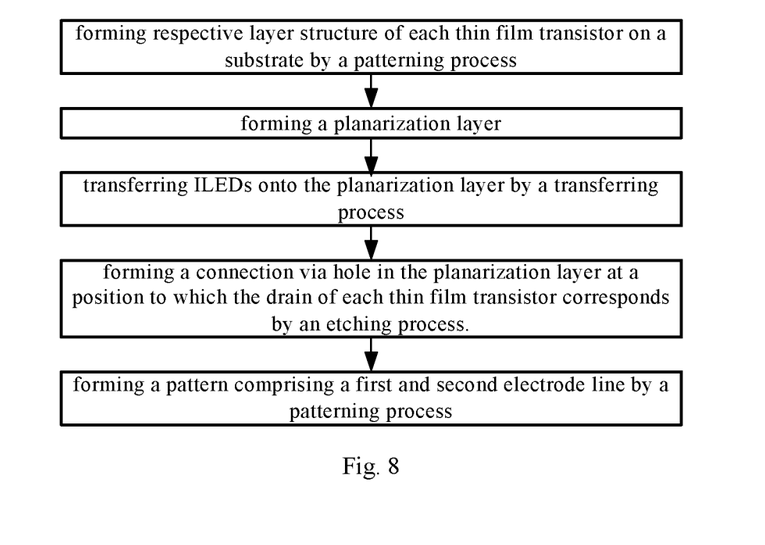
FIG. 8 is a flow chart for illustrating a method for fabricating an array substrate according to the first implementation of an embodiment of the present disclosure.

Embodiments of the present disclosure further provide a method for fabricating an array substrate. As shown in FIG. 8, the method includes the following steps 1-5.

Step 1 includes forming a pattern comprising respective layer structure, gate lines, and data lines of the thin film transistors 1 on the substrate 10, by a patterning process.

In the present embodiment, the substrate 10 for example is a rigid substrate or a flexible substrate. For example, the substrate 10 includes any one of glass, plastic, silica, and silicon. In case the substrate 10 includes organic plastic, the organic plastic for example is one or more of PET, PC, PMMA, and PI. The thin film transistor 1 can be any one of a polycrystalline silicon thin film transistor, an amorphous silicon thin film transistor, a monocrystalline silicon thin film transistor, an oxide thin film transistor, and an organic thin film transistor. In case the thin film transistor 1 is an oxide thin film transistor, the active layer for example includes phthalocyanine compounds, oligothiophene, fullerene, or the like.

In case the thin film transistor 1 formed in the above step is a bottom gate thin film transistor, the step includes forming a gate/gate line, a gate insulating layer, an active layer, and a source/drain/data line in this order.

Step 2 includes forming the planarization layer 2 on the substrate 10 resulting from step 1 by coating.

The planarization layer 2 for example includes polymethyl methacrylate (PMMA), polyimide (PI), polyvinyl alcohol (PVA), polyvinyl phenol (PVP) or the like.

Step 3 includes transferring ILEDS 8, on the substrate 10, resulting from step 2, onto the planarization layer 2 by a transferring process. At the same time, the driver ICs 6 can be transferred onto the planarization layer 2 by a transferring process.

Step 4, on the substrate 10 resulting from step 3, forming a connection hole in the planarization layer 2 at a position to which the drain of each thin film transistor 1 corresponds by an etching process.

Step 5, forming a pattern comprising the first electrode line 3 and the second electrode line 4 on the substrate 10 resulting from step 4 by a patterning process, wherein the first electrode line 3 connects the drain of each thin film transistor 1 with the first pole of each ILED 8 through the connection hole, and the second electrode line 4 is connected with the second pole of each ILED 8.

The fabrication of the array substrate is complete by the above steps.

The order of step 3 and step 4 can be reversed, which is not described in detail here.

Of course, apart from the above steps, the method can further include step 6 of forming a plurality of microlens units 5 on a light exit side of the array substrate. The microlens units 5 correspond with the ILEDs 8 in position, so as to increase the light extraction efficiency of ILEDs.

Figure 9:
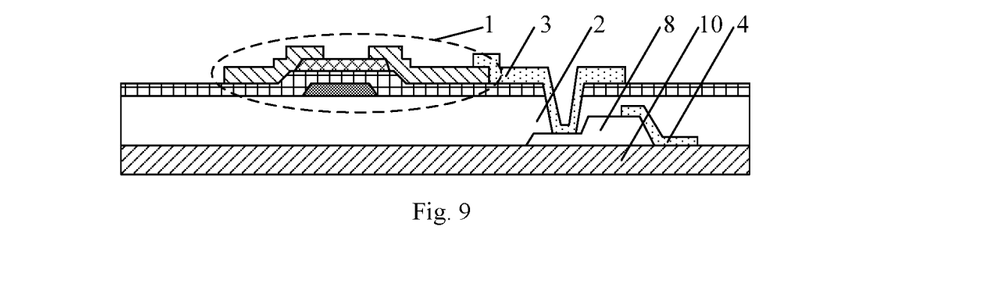
FIG. 9 is a schematic view for illustrating a pixel unit in an array substrate according to a second implementation of an embodiment of the present disclosure.

In a second implementation of the present embodiment, the array substrate differs from that of the first implementation in that the thin film transistors 1 are arranged on the ILEDs 8 with respect to the substrate 10.

As shown in FIG. 9, the array substrate includes: the substrate 10; ILEDs 8 on the substrate 10; the second electrode line 4 connected with the second pole of each ILED 8; the planarization layer 2 on a layer in which ILEDs 8 are located, wherein the planarization layer 2 is provided with a connection hole at a position to which the first pole of each ILED 8 corresponds; thin film transistors 1 on the planarization layer 2; and the first electrode line 3 which connects the drain of each thin film transistor 1 with the first pole of each ILED 8 through the connection hole. In the array substrate, gate lines are arranged in a same layer as the gate of each thin film transistor 1, and data lines are arranged in a same layer as the source and drain of each thin film transistor 1.

A passivation layer can further be arranged on the layer in which the thin film transistors 1 are located. Similar as the first implementation, a micro-driver IC 6, a sensor module, a camera module or the like can further be arranged on the planarization layer by micro-transferring, so as to form a multi-functional panel with a high integration density. This can increase the added value of the display panel, and the module can be light in weight.

A plurality of microlens units 5 can further be arranged on the passivation layer. The microlens units 5 correspond with the ILEDs 8 in position. Namely, the planarization layer 2 over each ILED 8 is covered by one of the microlens units 5, and the projection of each ILED 8 on the substrate 10 completely falls within that of each the microlens unit 5 on the substrate 10.

The microlens units 5 in this configuration facilitate increasing the light extraction efficiency of ILEDs 8.

Similar to the first implementation, in each pixel unit, the projection of each ILED 8 on the substrate 10 at least partially overlaps that of the thin film transistor 1, so as to realize an array substrate with a high resolution.

Figure 10:
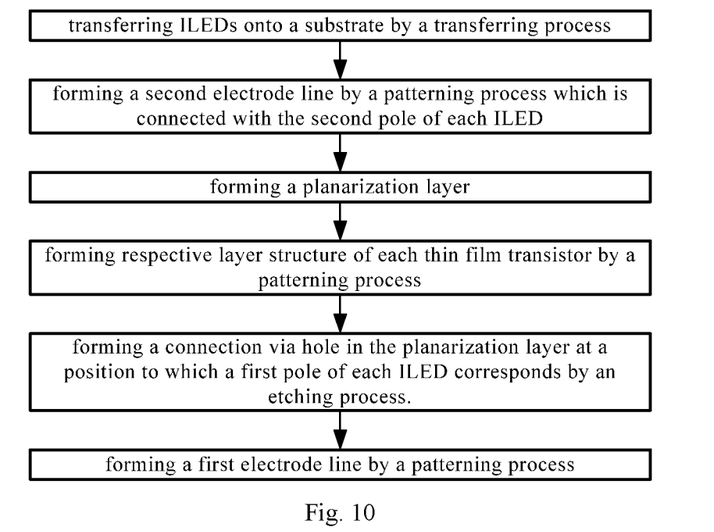
FIG. 10 is a flow chart for illustrating a method for fabricating an array substrate according to the second implementation of an embodiment of the present disclosure.

The present embodiment further provides a method for fabricating the array substrate as described in the above embodiment. As shown in FIG. 10, the method includes the following steps 1-5.

Step 1 includes transferring ILEDs 8 onto the substrate 10 by a transferring process. In exemplary embodiments, driver ICs 6 can further be transferred onto the substrate 10 by a transferring process.

In the present embodiment, the substrate 10 for example is a rigid substrate, or a flexible substrate. Namely, the substrate 10 includes any one of glass, plastic, silica, and silicon. In case the substrate 10 is an organic plastic, the organic plastic for example is one or more of PET, PC, PMMA, and PI.

Step 2 includes forming the second electrode line 4 on the substrate 10 resulting from step 1 by a patterning process. The second electrode line 4 is connected with the second pole of each ILED 8.

Step 3 includes forming the planarization layer 2 by coating on the substrate 10 resulting from step 2.

The planarization layer 2 includes for example polymethyl methacrylate (PMMA), polyimide (PI), polyvinyl alcohol (PVA), polyvinyl phenol (PVP) or the like.

Step 4 includes forming a pattern including a respective layer structure, gate lines, and data lines of the thin film transistor 1 on the substrate 10 resulting from step 3 by a patterning process.

The thin film transistor 1 for example is any one of a polycrystalline silicon thin film transistor, an amorphous silicon thin film transistor, a monocrystalline silicon thin film transistor, an oxide thin film transistor, and an organic thin film transistor. In case the thin film transistor 1 is an oxide thin film transistor, the active layer includes phthalocyanine compounds, oligothiophene, fullerene or the like.

In case the thin film transistor 1 formed in the above step is a bottom gate thin film transistor, the step includes forming a gate/gate line, a gate insulating layer, an active layer, and a source/drain/data line in this order.

Step 5 includes, forming a connection hole by an etching process in the planarization layer 2 at a position to which the first pole of each ILED 8 corresponds on the substrate 10 resulting from step 4.

Step 6 includes forming the first electrode line 3 by a patterning process, wherein the first electrode line connects the drain of each thin film transistor 1 with the first pole of each ILED 8 through the connection hole.

The fabrication of the array substrate is completed by the above steps.

Apart from the above steps, the method can further include step 7 and step 8. Step 7 includes forming a passivation layer on the substrate 10 resulting from step 6 by coating. Step 8 includes: forming a plurality of microlens units 5 over the passivation layer. The microlens units 5 correspond with the ILEDs 8 in position, so as to increase the light extraction efficiency of ILEDs 8.

Embodiments of the present disclosure provide a display device, which includes the array substrate described in the foregoing embodiments. Thus, the display device has advantages of high resolution, flexibility and transparency, high brightness, high contrast, lightness of weight, low consumption, wide gamut or the like.

In embodiments of the present disclosure, since the ILED has advantages of small size, high brightness, high contrast, lightness of weight, low consumption, wide gamut, high efficiency, long lifetime, quick response or the like, the array substrate onto which ILEDs are applied by transferring has a high resolution, an improved display effect or the like.

The display device can be a liquid crystal display device or an organic light emitting display device, and for example can be any product or component with a display function like a liquid crystal panel, electronic paper, OLED panel, mobile phone, tablet computer, TV set, monitor, notebook computer, digital photo frame, navigator or the like.

A person with ordinary skill in the art may find various modifications and variations to the present disclosure apparent without departing from the spirit and the scope of the present disclosure. Such modifications and variations of the present disclosure belong to the scope of the claims of the present disclosure and the equivalent technologies thereof, and the present disclosure also intends to encompass these modifications and variations.

What is claimed is:

1. An array substrate, comprising a substrate and a plurality of pixel units on the substrate, wherein each pixel unit comprises at least one thin film transistor and at least one ILED,
    wherein in each pixel unit, a drain of the at least one thin film transistor is connected with a first pole of the at least one ILED through a first electrode line, a second pole of the at least one ILED is connected through a second electrode line and at least a part of the first electrode line, at least a part of the second electrode line are both on a side of the at least one ILED facing away from the substrate, an orthographic projection of the first electrode line on the substrate and an orthographic projection of the second electrode line on the substrate are separated, and an orthographic projection of one of the at least one ILED on the substrate is completely inside an orthographic projection of a corresponding one of the at least one thin film transistor on the substrate.

2. The array substrate of claim 1, further comprising a planarization layer, wherein the at least one thin film transistor, the planarization layer and the at least one ILED are arranged on the substrate such that the planarization layer is provided with connection holes at positions each corresponding to the drain of a corresponding one of the at least one thin film transistor, and wherein the first electrode lines respectively connect the drain of each of the at least one thin film transistor with the first pole of a corresponding one of the at least one ILED through the connection holes.

3. The array substrate of claim 1, further comprising a planarization layer, wherein the at least one ILED, the planarization layer and the at least one thin film transistor are arranged on the substrate such that the planarization layer is provided with connection holes at positions corresponding to the first pole of a corresponding one of the at least one ILED, and wherein the first electrode lines respectively connect the drain of each of the at least one thin film transistor with the first pole of the at least one ILED through the connection holes.

4. The array substrate of claim 1, wherein the first electrode line and the second electrode line are arranged in a same layer.

5. The array substrate of claim 1, wherein in each pixel unit, a projection of each of the at least one ILED on the substrate at least partially overlaps a projection of a corresponding one of the at least one thin film transistor on the substrate.

6. The array substrate of claim 1, further comprising a plurality of driver ICs, which are arranged in a same layer as the at least one ILED and configured to provide signals for gate lines or data lines on the array substrate.

7. The array substrate of claim 1, further comprising a plurality of microlens units which are arranged on a light exit side of the array substrate, wherein the microlens units correspond with the at least one ILED in position.

8. The array substrate of claim 7, wherein a projection of each of the at least one ILED on the substrate is inside a projection of a corresponding microlens unit on the substrate.

9. The array substrate of claim 1, wherein the plurality of pixel units are arranged in a matrix, and the second electrode lines that respectively connect with a corresponding one of the second poles of the at least one ILED in a same row are connected with a same signal input line.

10. The array substrate of claim 1, wherein the substrate comprises any one of glass, plastic, silica, and silicon.

11. The array substrate of claim 1, wherein the at least one thin film transistor comprises any one of a polycrystalline silicon thin film transistor, an amorphous silicon thin film transistor, a monocrystalline silicon thin film transistor, an oxide thin film transistor, and an organic thin film transistor.

12. A display device, comprising the array substrate of claim 1.

13. The array substrate of claim 1, further comprising
    a planarization layer on a side of the at least one thin film transistor facing away from the substrate, comprising second connection holes, and
    signal input lines on a same layer as the source of the at least one thin film transistor, wherein the second electrode lines are respectively connected to the signal input lines through the second connection holes.

14. A method for fabricating an array substrate, comprising:
    forming thin film transistors and ILEDs on a substrate, wherein the ILEDs are formed on the substrate by a transferring process, a drain of each one of the thin film transistors is connected with a first pole of each one of the ILEDs through a first electrode line, a second pole of the each one of the ILEDs is connected through a second electrode line, and at least a part of the first electrode line and at least a part of the second electrode line are both on a side of the ILEDs facing away from the substrate, an orthographic projection of the first electrode line on the substrate and an orthographic projection of the second electrode line on the substrate are separated, and an orthographic projection of one of the at least one ILED on the substrate is completely inside an orthographic projection of a corresponding one of the at least one thin film transistor on the substrate.

15. The method for fabricating the array substrate of claim 14, wherein forming the thin film transistors and the ILEDs on the substrate comprises:
    forming the thin film transistors on the substrate by a patterning process;
    forming a planarization layer;
    transferring the ILEDs onto the planarization layer by a transferring process;
    forming a connection hole in the planarization layer at a position to which the drain of each thin film transistor corresponds by an etching process; and
    forming a pattern comprising the first electrode line and the second electrode line by a patterning process, wherein the first electrode line connects the drain of each thin film transistor with the first pole of each ILED through the connection hole, and the second electrode line is connected with the second pole of the ILED.

16. The method for fabricating the array substrate of claim 15, further comprising:
    during transferring of the ILEDs onto the planarization layer by the transferring process, transferring a plurality of driver ICs onto the planarization layer by the transferring process as well.

17. The method for fabricating the array substrate of claim 15, wherein forming the thin film transistors and the ILEDs on the substrate further comprises:
forming signal input lines on a same layer as sources of the thin film transistors, and
forming second connection holes on the planarization layer at locations corresponding to the signal input lines by the etching process;
wherein the second electrode lines are respectively connected to the signal input lines through second connection holes.

18. The method for fabricating the array substrate of claim 14, wherein forming the thin film transistors and the ILEDs on the substrate comprises:
transferring the ILED onto the substrate by a transferring process;
forming the second electrode line by a patterning process, wherein the second electrode line is connected with the second pole of the ILED;
forming a planarization layer;
forming the thin film transistors by a patterning process;
forming a connection hole in the planarization layer at a position to which the first pole of each ILED corresponds, by an etching process; and
forming the first electrode line by a patterning process, wherein the first electrode line connects the drain of each thin film transistor with the first pole of each ILED through the connection hole.

19. The method for fabricating the array substrate of claim 18, further comprising:
during transferring of the ILED onto the substrate by the transferring process, transferring a plurality of driver ICs onto the substrate by a transferring process.

20. The method for fabricating an array substrate of claim 14, further comprising:
forming a plurality of microlens units on a light exit side of the array substrate, wherein the microlens units correspond with ILEDs in position.

* * * * *